United States Patent
Yu et al.

(10) Patent No.: US 7,196,372 B1
(45) Date of Patent: Mar. 27, 2007

(54) FLASH MEMORY DEVICE

(75) Inventors: Bin Yu, Cupertino, CA (US);
Ming-Ren Lin, Cupertino, CA (US);
Srikanteswara Dakshina-Murthy,
Austin, TX (US); Zoran Krivokapic,
Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/614,177

(22) Filed: Jul. 8, 2003

(51) Int. Cl.
*H01L 29/788* (2006.01)
(52) U.S. Cl. ........................... 257/316; 257/315
(58) Field of Classification Search ............. 257/315, 257/316
See application file for complete search history.

(56) References Cited

U.S. PATENT DOCUMENTS

| | | | |
|---|---|---|---|
| 5,411,905 A * | 5/1995 | Acovic et al. | 438/156 |
| 6,525,369 B1 | 2/2003 | Wu | 257/315 |
| 6,768,158 B2 | 7/2004 | Lee et al. | |
| 6,903,967 B2 | 6/2005 | Mathew et al. | 365/177 |
| 6,969,656 B2 | 11/2005 | Du et al. | 438/268 |
| 2002/0072170 A1 | 6/2002 | Lam | |
| 2002/0137271 A1 | 9/2002 | Forbes et al. | |
| 2003/0178670 A1* | 9/2003 | Fried et al. | 257/315 |

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.

Yang-Kyu Choi et al., "Sub-20nm CMOS FinFET Technologies," 2001 IEEE, IEDM, pp. 421-424.

Xuejue Huang et al., "Sub-50 nm P-Channel FinFET," IEEE Transactions on Electron Devices, vol. 48, No. 5, May 2001, pp. 880-886.

Xuejue Huang et al., "Sub 50-nm FinFET: PMOS," 1999 IEEE, IEDM, pp. 67-70.

Yang-Kyu Choi et al., "Nanoscale CMOS Spacer FinFET for the Terabit Era," IEEE Electron Device Letters, vol. 23, No. 1, Jan. 2002, pp. 25-27.

Co-pending U.S. Appl. No. 10/770,010; by Yider Wu et al., filed Feb. 3, 2004 entitled: "Non-Volatile Memory Device," 21 page specification, 11 sheets of drawings.

Co-pending U.S. Appl. No. 10/632,971; by Ming-Ren Lin et al., filed Aug. 4, 2003 entitled: "FinFET Flash Memory," 11 page specification, 9 sheets of drawings.

Co-pending U.S. Appl. No. 10/929,538 by Yu et al., filed Aug. 31, 2004, entitled "Non-Volatile Memory Device", 25 pages.

* cited by examiner

*Primary Examiner*—Zandra V. Smith
*Assistant Examiner*—Kiesha Rose
(74) *Attorney, Agent, or Firm*—Harrity Snyder, LLP

(57) ABSTRACT

A non-volatile memory device includes a substrate, an insulating layer, a fin, an oxide layer, spacers and one or more control gates. The insulating layer is formed on the substrate and the fin is formed on the insulating layer. The oxide layer is formed on the fin and acts as a tunnel oxide for the memory device. The spacers are formed adjacent the side surfaces of the fin and the control gates are formed adjacent the spacers. The spacers act as floating gate electrodes for the non-volatile memory device.

16 Claims, 10 Drawing Sheets

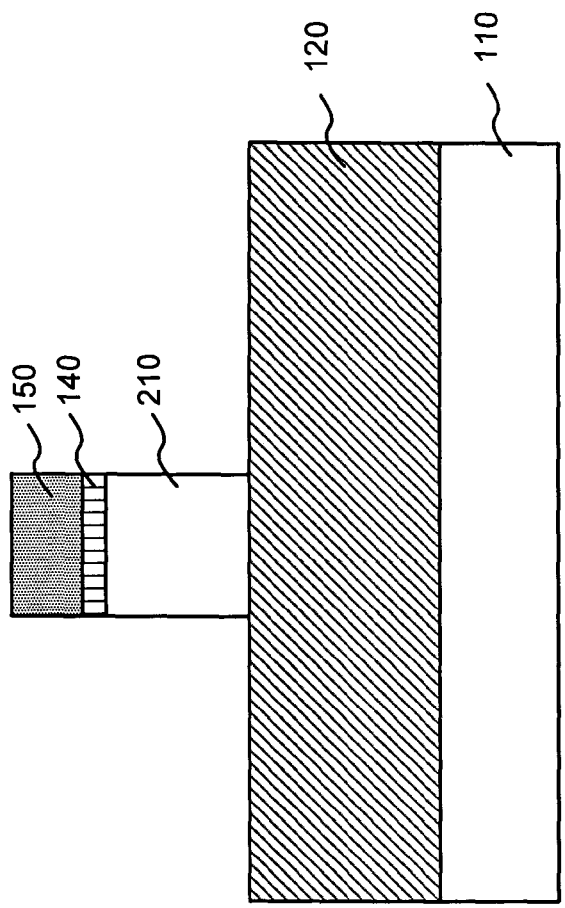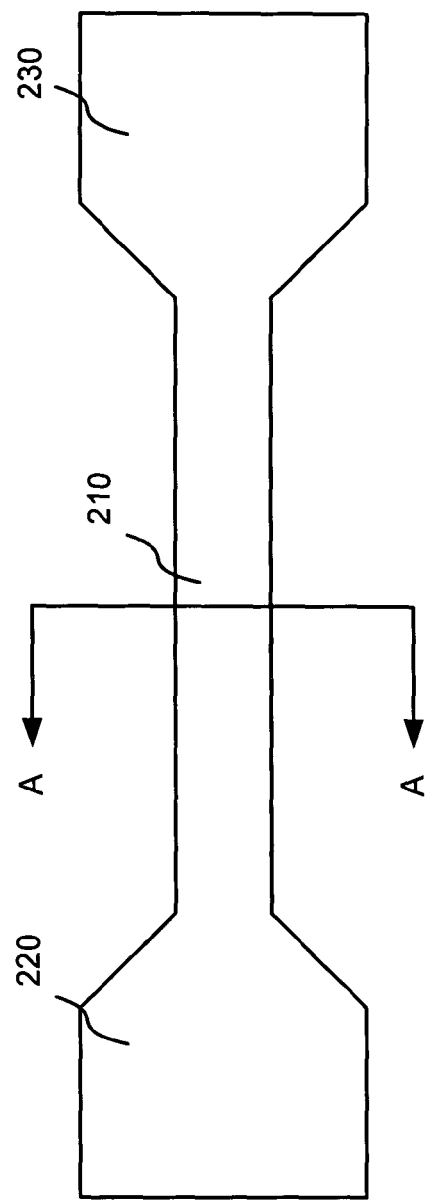

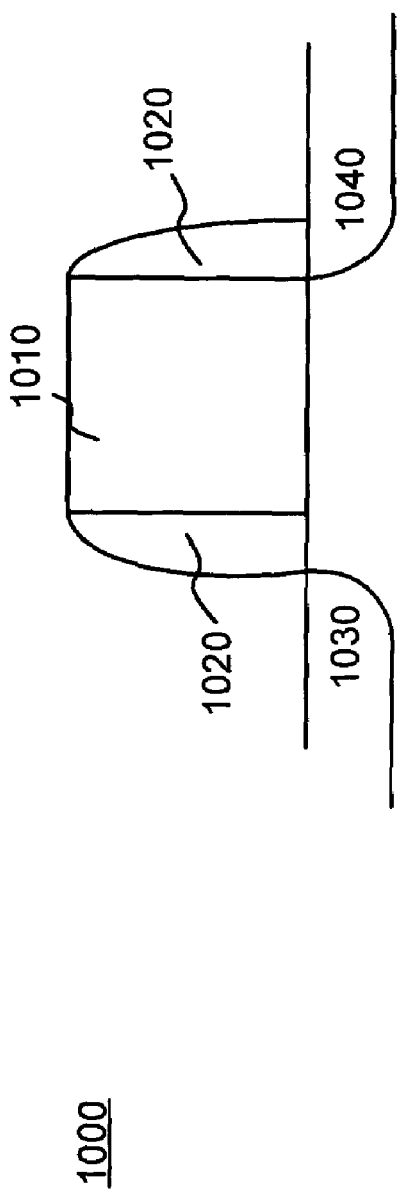
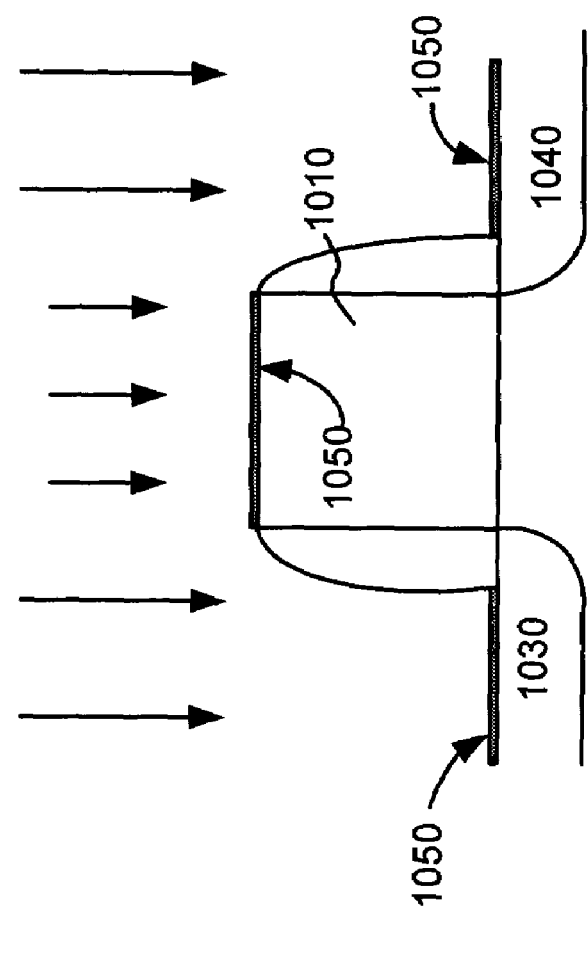

FLASH MEMORY DEVICE

TECHNICAL FIELD

The present invention relates to memory devices and methods of manufacturing memory devices. The present invention has particular applicability to non-volatile memory devices.

BACKGROUND ART

The escalating demands for high density and performance associated with non-volatile memory devices require small design features, high reliability and increased manufacturing throughput. The reduction of design features, however, challenges the limitations of conventional methodology. For example, the reduction of design features makes it difficult for the memory device to meet its expected data retention requirement, e.g., a ten year data retention requirement.

DISCLOSURE OF THE INVENTION

Implementations consistent with the present invention provide a non-volatile memory device that includes spacers formed on side surfaces of a fin structure. The spacers may be used as floating gate electrodes for the non-volatile memory device. A control gate may be formed on either side of the spacers, with the control gates being separated from the floating gates by a dielectric layer.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a memory device that includes a substrate, an insulating layer, a fin structure, first and second spacers, a gate dielectric layer and first and second gates. The insulating layer is formed on the substrate and the fin structure is formed on the insulating layer. The fin structure has a first and second side surface. The first spacer is formed adjacent the first side surface of the fin structure and acts as a first floating gate for the memory device. The second spacer is formed adjacent the second side surface of the fin structure and acts as a second floating gate for the memory device. The gate dielectric layer is formed on the first and second spacers. The first gate is formed on the insulating layer and is disposed on a first side of the fin and the second gate is formed on the insulating layer and disposed on a second side of the fin opposite the first side.

According to another aspect of the invention, a method of manufacturing a non-volatile memory device is provided. The method includes forming a fin on an insulating layer, where the fin includes first and second side surfaces and a top surface. The method also includes forming a first dielectric layer on the first and second side surfaces of the fin, forming source and drain regions and forming first and second spacers adjacent the respective first and second side surfaces of the fin and abutting the dielectric layer, where the first and second spacers act as floating gates for the non-volatile memory device. The method further includes forming a second dielectric layer on the first and second spacers, and depositing a gate material over the insulating layer, the second dielectric layer, the first and second spacers and the fin. The method also includes planarizing the gate material and patterning and etching the gate material to form a first control gate and a second control gate adjacent the first and second spacers, respectively.

According to another aspect of the invention, a non-volatile memory device that includes a substrate, an insulating layer, a conductive fin, an oxide layer, a first spacer and a first gate is provided. The insulating layer is formed on the substrate and the conductive fin is formed on the insulating layer, where the conductive fin has first and second side surfaces and a top surface. The oxide layer is formed on the first and second side surfaces of the conductive fin. The first spacer is formed adjacent the first side surface of the fin and acts as a floating gate electrode. The first gate is formed on the insulating layer and acts as a first control gate for the non-volatile memory device.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIG. 2A is a cross-section illustrating the formation of a fin in accordance with an exemplary embodiment of the present invention.

FIG. 2B schematically illustrates the top view of the semiconductor device of FIG. 2A in accordance with an exemplary embodiment of the present invention.

FIGS. 10A and 10B are cross-sections illustrating the formation of doped source/drain areas in accordance with another embodiment of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide non-volatile memory devices, such as flash memory devices, and methods of manufacturing such devices. The flash memory devices may include a fin structure and spacers formed adjacent the fin. The spacers may act as a floating gate for the flash memory device.

Figure 1:
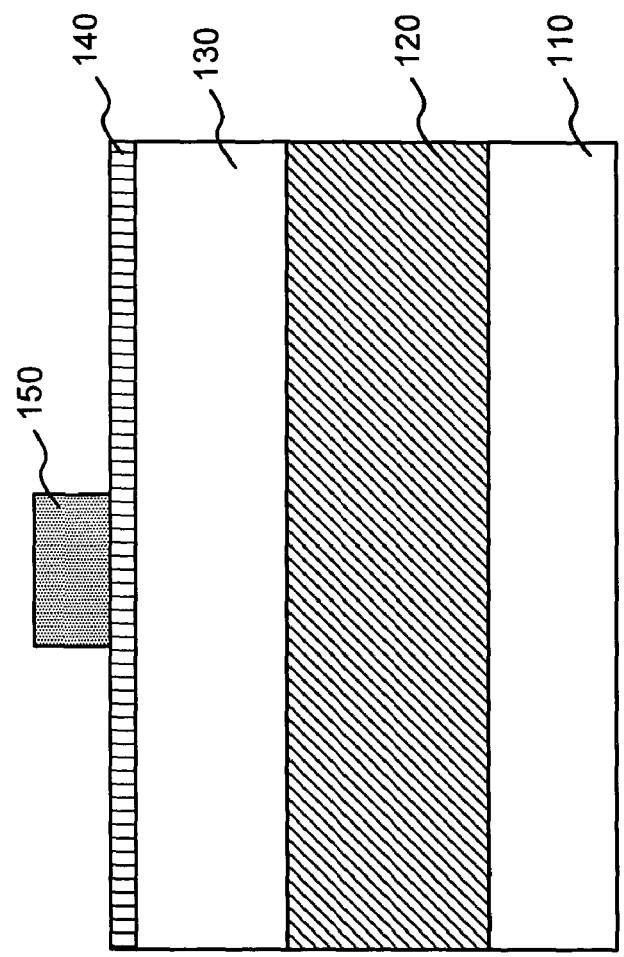
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 on the buried oxide layer 120. Buried oxide layer 120 and silicon layer 130 may be formed on substrate 110 in a conventional manner.

In an exemplary implementation, buried oxide layer 120 may include a silicon oxide, such as $SiO_2$, and may have a thickness ranging from about 1500 Å to about 3000 Å. Silicon layer 130 may include monocrystalline or polycrystalline silicon having a thickness ranging from about 500 Å to about 1000 Å. Silicon layer 130 may be used to form a fin structure, as described in more detail below.

In alternative implementations consistent with the present invention, substrate 110 and layer 130 may comprise other semiconducting materials, such as germanium, or combinations of semiconducting materials, such as silicon-germanium. Buried oxide layer 120 may also include other dielectric materials.

A dielectric layer 140, such as a silicon nitride layer or a silicon oxide layer, may be formed over silicon layer 130 to act as a protective cap during subsequent etching processes. In an exemplary implementation, dielectric layer 140 may be deposited at a thickness ranging from about 100 Å to about 300 Å. Next, a photoresist material may be deposited and patterned to form a photoresist mask 150 for subsequent processing. The photoresist may be deposited and patterned in any conventional manner.

Semiconductor device 100 may then be etched. In an exemplary implementation, silicon layer 130 and dielectric layer 140 may be etched in a conventional manner, with the etching terminating on buried oxide layer 120, as illustrated in FIG. 2A. Referring to FIG. 2A, dielectric layer 140 and silicon layer 130 have been etched to form a fin 210 comprising silicon with a dielectric cap 140. In an exemplary implementation, the width of fin 210 ranges from about 100 Å to about 1000 Å.

After the formation of fin 210, source and drain regions may be formed adjacent the respective ends of fin 210. For example, in an exemplary embodiment, a layer of silicon, germanium or combination of silicon and germanium may be deposited, patterned and etched in a conventional manner to form source and drain regions. Alternatively, the silicon layer 130 may be patterned and etched to form source and drain regions. FIG. 2B illustrates a top view of semiconductor 100 including source region 220 and drain region 230 formed adjacent fin 210 on buried oxide layer 120, according to an exemplary embodiment of the present invention.

Figure 3:
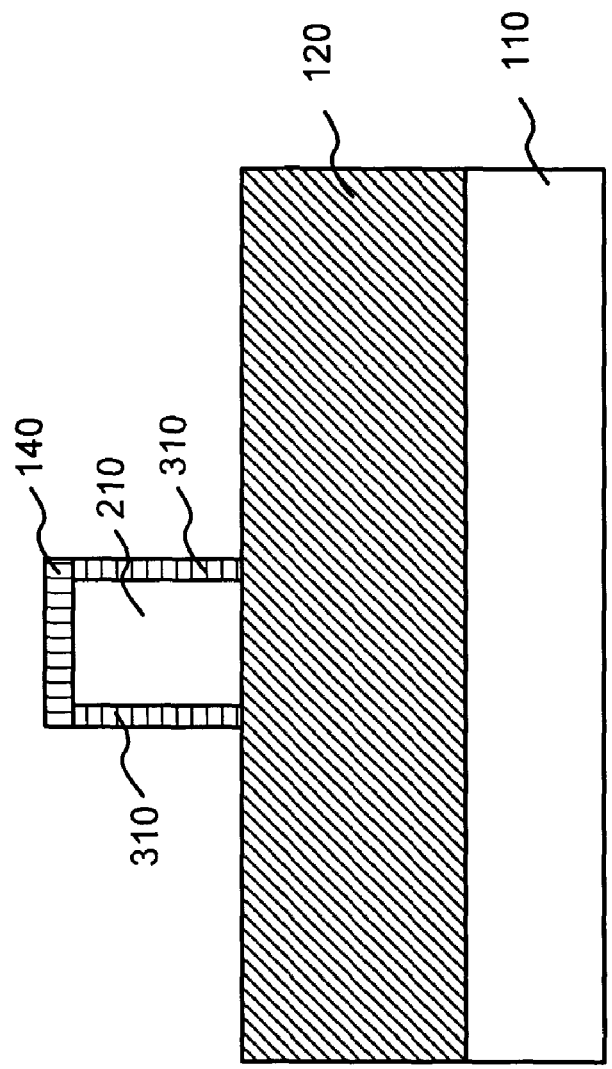
FIG. 3 is a cross-section illustrating the formation of a dielectric layer on the fin of FIG. 2A in accordance with an exemplary embodiment of the present invention.

The photoresist mask 150 may be removed and a dielectric layer may then be formed on fin 210. For example, a thin oxide layer 310, such as $SiO_2$, may be thermally grown on fin 210, as illustrated in FIG. 3. The cross-sectional view of FIG. 3 is taken along line AA in FIG. 2B. The oxide layer 310 may be grown to a thickness of about 10 Å to about 100 Å and may be formed on the exposed silicon side surfaces of fin 210. The dielectric cap 140, however, protects the top surface of fin 210. The oxide layer 310 may act as a tunnel oxide layer for the semiconductor device 100.

Figure 4:
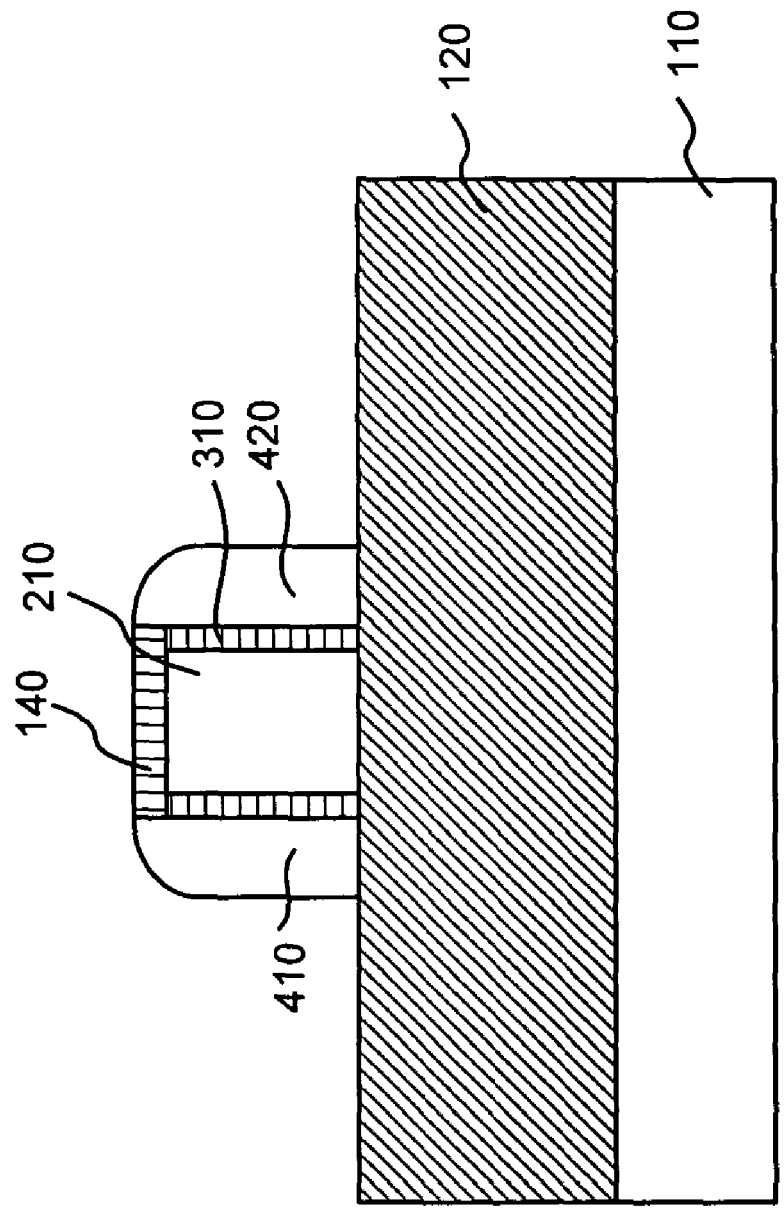
FIG. 4 is a cross-section illustrating the formation of spacers on the device of FIG. 3 in accordance with an exemplary embodiment of the present invention.

A conductive layer, such as undoped polycrystalline silicon, may then be deposited over semiconductor device 100 and etched to form structures 410 and 420, also referred to as spacers 410 and 420, as illustrated in FIG. 4. The spacers 410 and 420 may be formed on the buried oxide layer 120 adjacent the fin 210 and abut the oxide layer 310 and dielectric cap 140. Alternatively, another conductive material, such as germanium or combinations of silicon and germanium may be used to form spacers 410 and 420. According to an exemplary implementation consistent with the present invention, the width of spacers 410 and 420 may range from about 100 Å to about 500 Å. The spacers 410 and 420 may act as floating gate electrodes for the semiconductor device 100.

Figure 5:
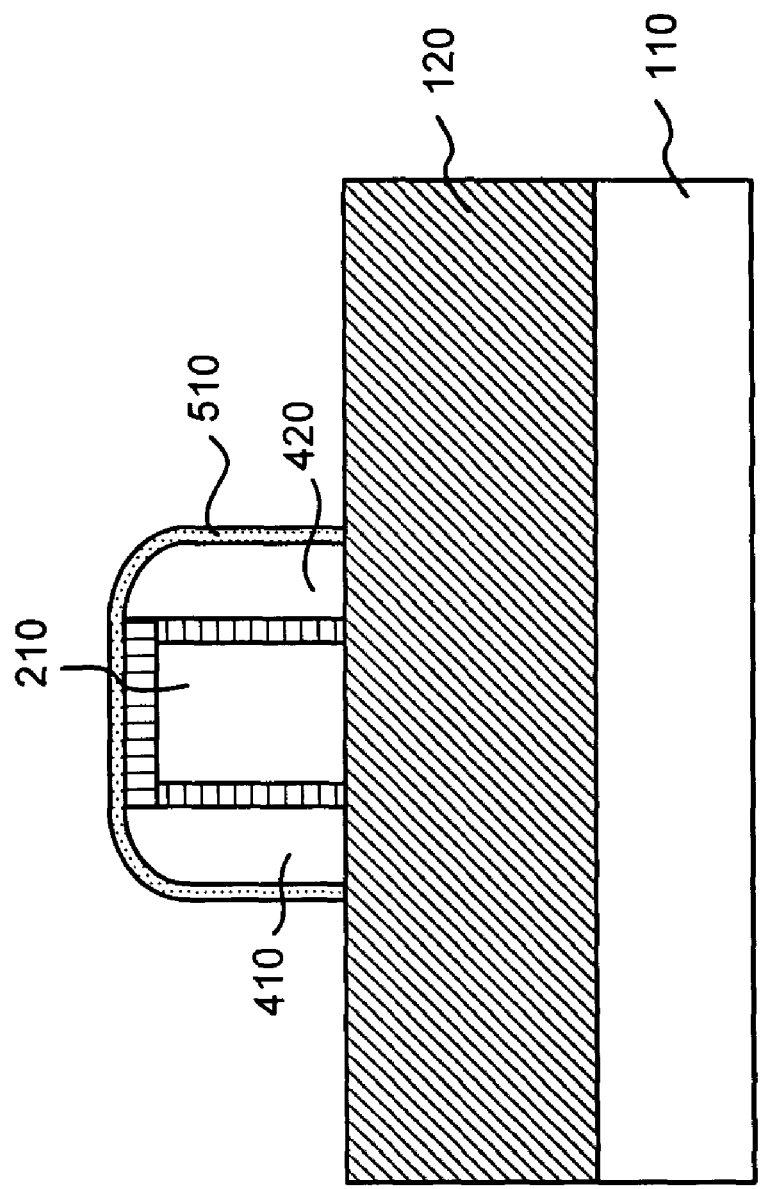
FIG. 5 is a cross-section illustrating the formation of an inter-gate dielectric layer on the spacers of FIG. 4 in accordance with an exemplary embodiment of the present invention.

After the spacers 410 and 420 are formed, a dielectric layer may be formed on the exposed side surfaces of spacers 410 and 420 and over the dielectric cap 140. For example, a thin oxide film 510, such as $SiO_2$, may be thermally grown on spacers 410 and 420 and dielectric cap 140, as illustrated in FIG. 5. The oxide film 510 may be grown to a thickness of about 50 Å to about 200 Å and may act as an inter-gate dielectric. In alternative implementations, oxide film 510 may be formed on the exposed surfaces of spacers 410 and 420, but may not be formed over the dielectric cap 140. In this case, the dielectric cap 140 may function as part of the inter-gate dielectric layer.

Figure 6:
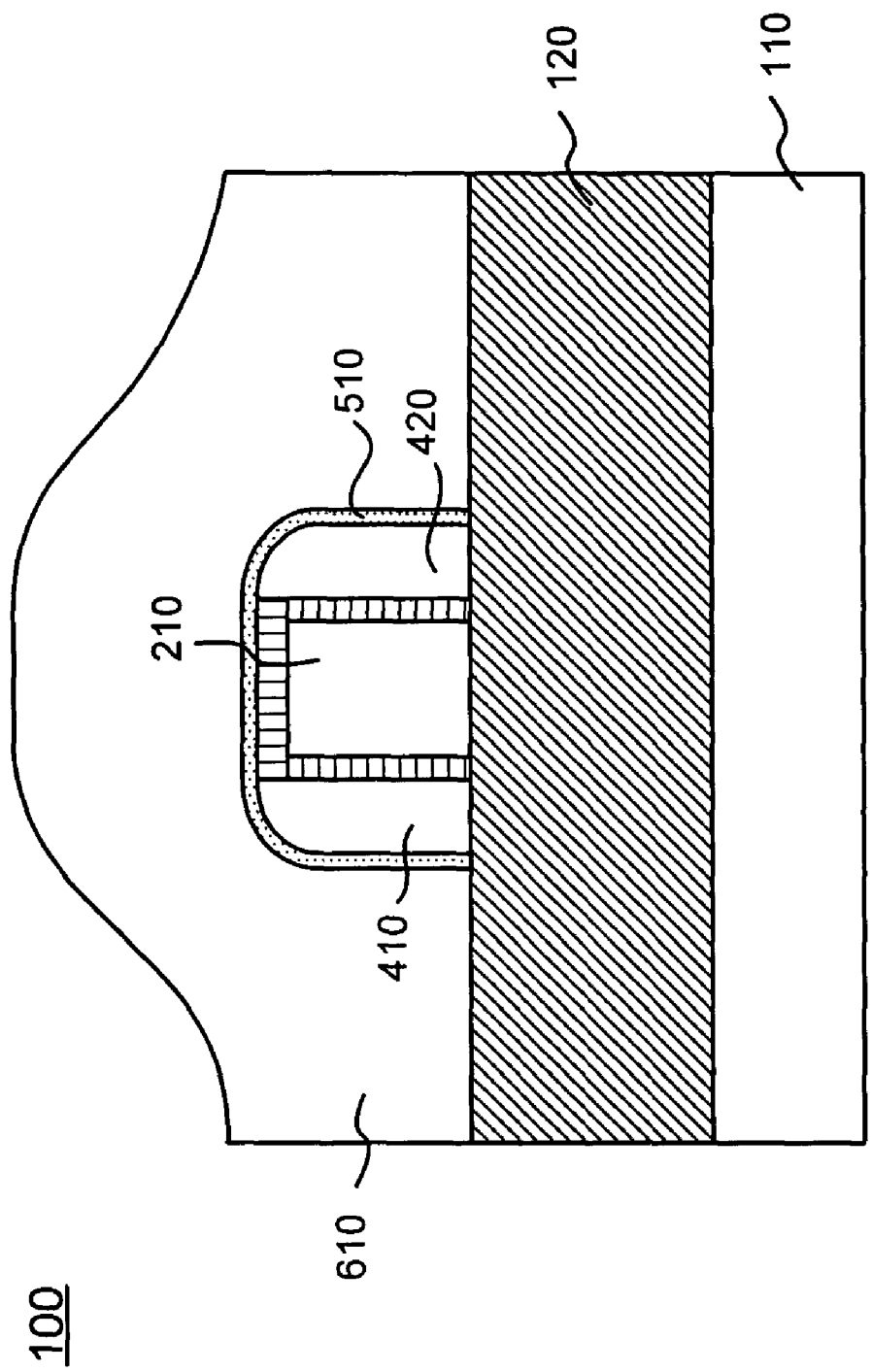
FIG. 6 is a cross-section illustrating the formation of a gate material on the device of FIG. 5 in accordance with an exemplary embodiment of the present invention.

A silicon layer 610 may then be deposited over semiconductor 100 in a conventional manner, as illustrated in FIG. 6. The silicon layer 610 may be used as gate material for the subsequently formed control gate electrodes. In an exemplary implementation, the silicon layer 610 may comprise polysilicon deposited using conventional chemical vapor deposition (CVD) to a thickness ranging from about 200 Å to about 1000 Å. Alternatively, other semiconducting materials, such as germanium or combinations of silicon and germanium, or various metals may be used as the gate material.

Figure 7:
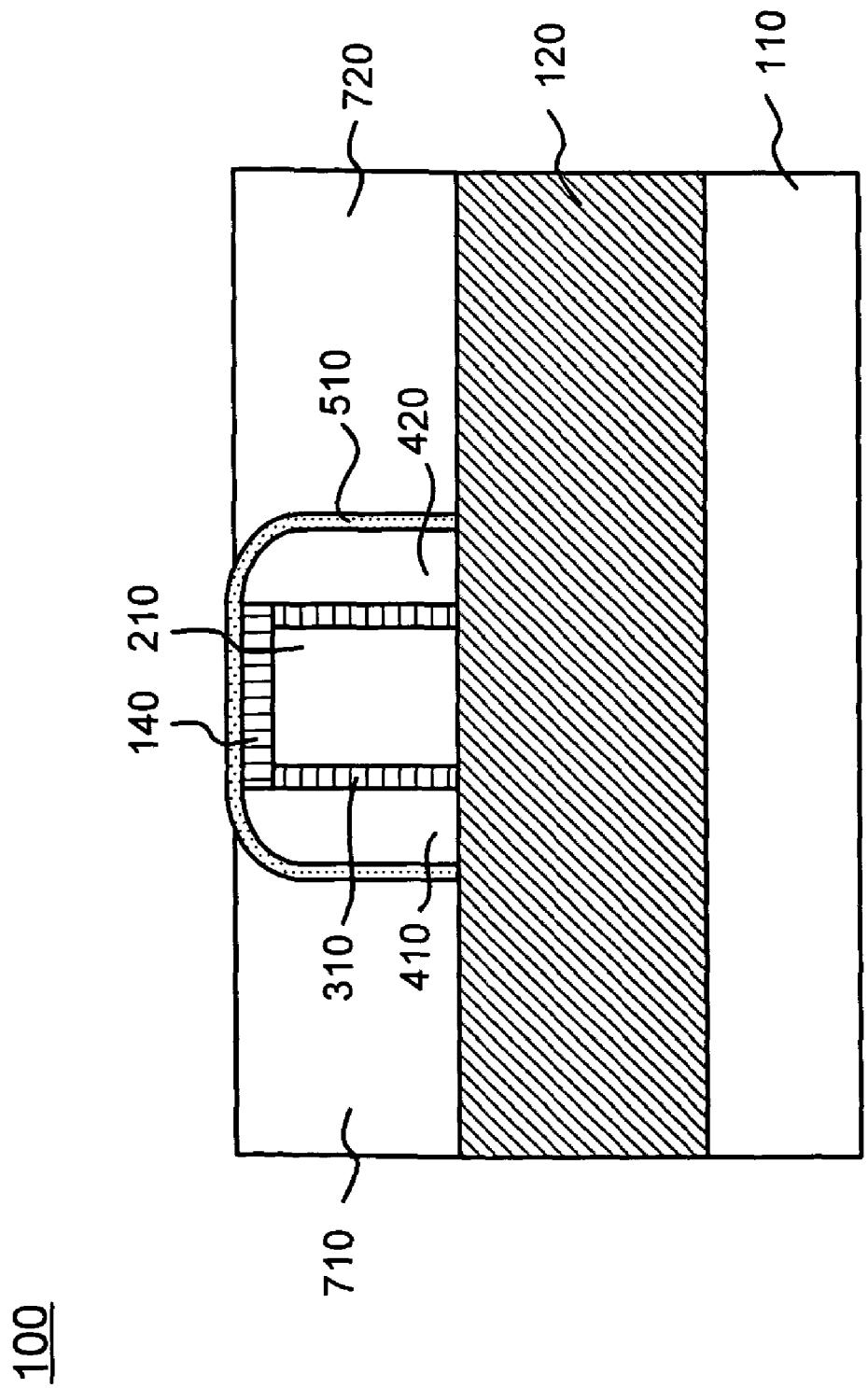
FIG. 7 is a cross-section illustrating the planarizing of the gate material in accordance with an exemplary embodiment of the present invention.

Semiconductor device 100 may then be planarized. For example, a chemical-mechanical polishing (CMP) may be performed so that the gate material (i.e., silicon layer 610) is even with or nearly even with dielectric cap 140 in the vertical direction, as illustrated in FIG. 7. Referring to FIG. 7, silicon layer 610 (FIG. 6) now includes regions 710 and 720 that are effectively separated from each other both physically and electrically.

Figure 8:
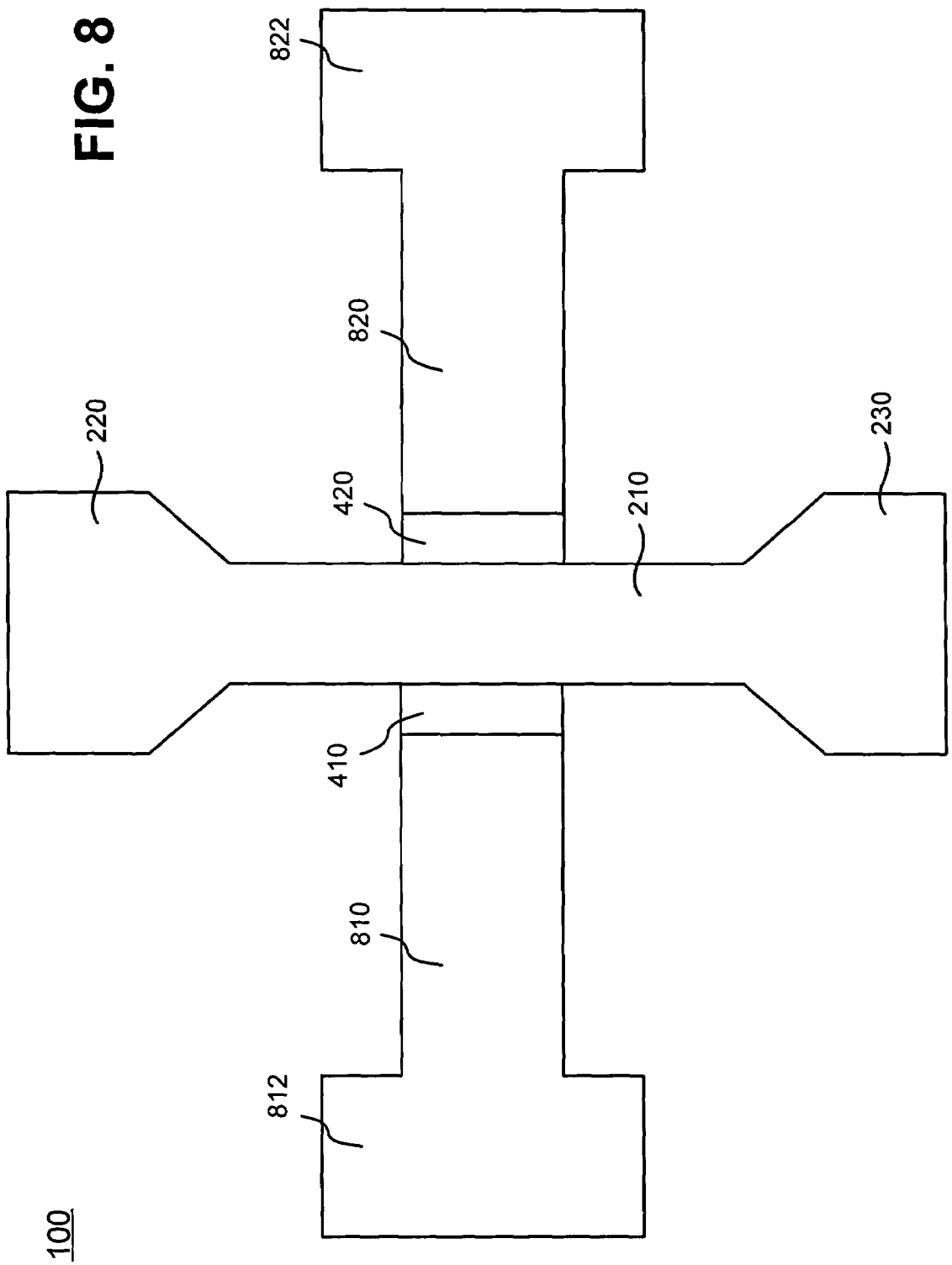
FIG. 8 is a top view illustrating an exemplary memory device formed in accordance with an exemplary embodiment of the present invention.

Regions 710 and 720 may then be patterned and etched to form the control gates for semiconductor device 100. For example, FIG. 8 illustrates a top view of semiconductor device 100 consistent with the present invention after the control gate electrodes are formed. As illustrated, semiconductor device 100 includes a double gate structure with gates 810 and 820 disposed on either side of spacers 410 and 420. The gate dielectric layers 310 and 510 and dielectric cap 140 are not shown in FIG. 8 for simplicity. Gates 810 and 820 may include gate electrodes or contacts 812 and 822 formed at the respective ends of gates 810 and 820, as illustrated in FIG. 8.

The source/drain regions 220 and 230 may then be doped. For example, n-type or p-type impurities may be implanted in source/drain regions 220 and 230. For example, an n-type dopant, such as phosphorous, may be implanted at a dosage of about $1\times10^{15}$ atoms/cm$^2$ to about $1\times10^{16}$ atoms/cm$^2$ and an implantation energy of about 10 KeV to about 40 KeV. Alternatively, a p-type dopant, such as boron, may be implanted at similar dosages and implantation energies. The particular implantation dosages and energies may be selected based on the particular end device requirements. One or ordinary skill in this art would be able to optimize the source/drain implantation process based on the circuit requirements. In addition, sidewall spacers may optionally be formed prior to the source/drain ion implantation to control the location of the source/drain junctions based on the particular circuit requirements. Activation annealing may then be performed to activate the source/drain regions 220 and 230.

The resulting semiconductor device 100 illustrated in FIG. 8 includes a first gate 810 and a second gate 820 and can operate as a non-volatile memory device, such as a flash electrically erasable programmable read only memory (EEPROM). Each of gates 810 and 820 function as control gates for the flash memory device and each of spacers 410 and 420 function as floating gate electrodes for gates 810 and 820, respectively. Programming may be accomplished by applying a bias of, for example, about 5–15 volts to control gate 810 or 820. For example, if the bias is applied to control gate 810, electrons may tunnel from the source/drain regions 220/230 into spacer 410 (i.e., the floating gate electrode) via fin 210 and oxide layer 310. A similar process may occur if the bias is applied to control gate 820. That is, electrons may tunnel into spacer 420.

Erasing may be accomplished by applying a bias of, for example, about 5–15 volts to control gate 810 or 820. During erasing, electrons may tunnel from the floating gate 410 or 420 into the source/drain regions 220 and 230 via oxide layer 310 and fin 210.

Thus, in accordance with the present invention, a flash memory device is formed with electrically separated control gates 810 and 820. The control gates 810 and 820 each have separate floating gates 410 and 420 that may be independently programmed, thereby resulting in increased circuit density and increased circuit flexibility. The present invention can also be easily integrated into conventional semiconductor fabrication processing.

OTHER EMBODIMENTS

Figure 9A:
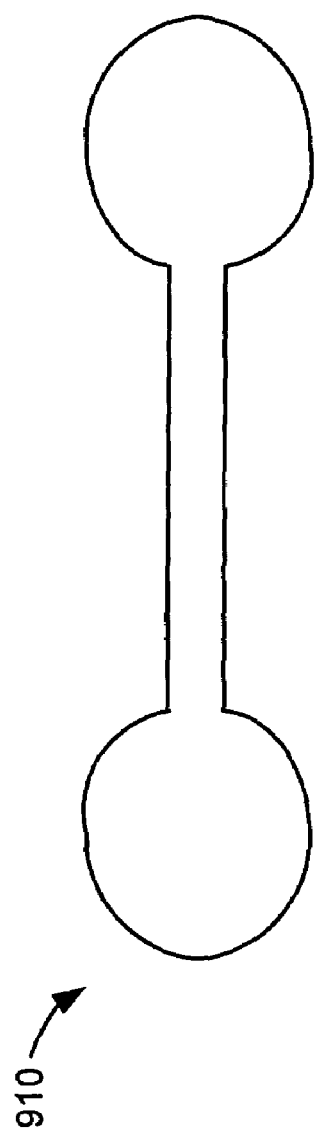
FIGS. 9A–9C are cross-sections illustrating the formation of masks for use in a FinFET device in accordance with another embodiment of the present invention.
Figure 9B:
Figure 9C:
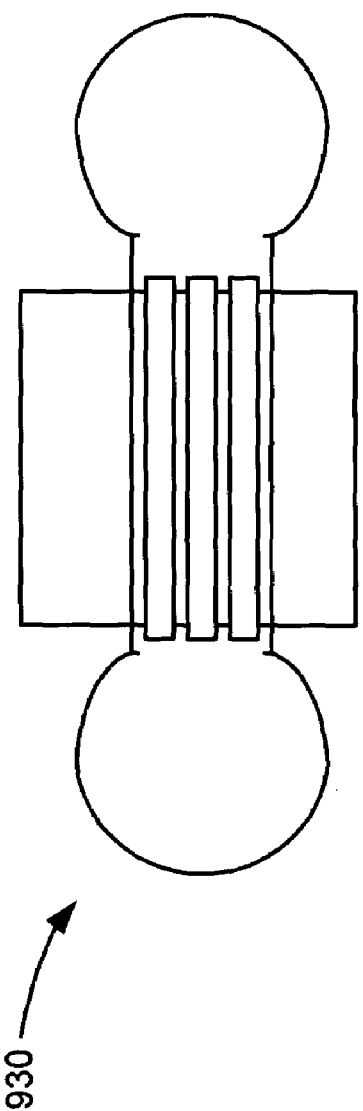

In other embodiments of the present invention, FinFETs with multiple fins may be formed. FIG. 9A illustrates a top view of a mask 910 that protects the active source and drain regions of a FinFET. A second mask 920 may then be formed, as illustrated in FIG. 9B. Mask 920 may be used to define the fins in the channel region of the FinFET. The two masks 910 and 920 may then be combined to form dual active mask 930, as illustrated in FIG. 9C. The mask 930 may then be used to form the fins and to protect the active source/drain areas of the FinFET. Using the dual mask 930, multiple FinFETs may be formed, thereby yielding increased transistor density. The FinFETs may then be used to form a ring oscillator or other circuits.

In another embodiment of the present invention, a FinFET with a uniformly doped source/drain may be formed. In this embodiment, a semiconductor device 1000 that includes gate 1010, spacers 1020 and source/drain regions 1030 and 1040 may be formed, as illustrated in FIG. 10A. The semiconductor device 1000 may be a FinFET device. The fin(s) in device 1000, however, is not shown for simplicity.

After the gate 1010, spacers 1020 and source/drain regions 1030 and 1040 are formed, the source/drain regions 1030 and 1040 may be doped. For example, n-type or p-type impurities may be implanted in source region 1030 and drain region 1040.

After the source/drain implant, an absorb layer 1050 may be deposited, as illustrated in FIG. 10B. After the absorb layer 1050 is deposited, a laser thermal annealing may be performed on semiconductor device 1000 as illustrated by the arrows in FIG. 10B. During the laser thermal annealing, a portion of the source/drain areas 1030 and 1040 may be melted. After the laser thermal annealing, the implanted dopant in the source/drain regions 1030 and 1040 will be activated and uniformly distributed in the vertical direction.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable in the manufacturing of double-gate semiconductor devices and particularly in FinFET devices with design features of 100 nm and below. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail. In addition, while a series of processes for forming the semiconductor device of FIG. 9B has been described, it should be understood that the order of the process steps may be varied in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

In addition, no element, act, or instruction used in the description of the present application should be construed as critical or essential to the invention unless explicitly described as such. Also, as used herein, the article "a" is intended to include one or more items. Where only one item is intended, the term "one" or similar language is used.

What is claimed is:

1. A memory device, comprising:

a substrate;

an insulating layer formed on the substrate;

a fin structure formed on the insulating layer, the fin structure having a first and second side surface and a top surface;

a dielectric cap formed over the top surface of the fin structure;

a first spacer formed adjacent the first side surface, the first spacer acting as a first floating gate for the memory device;

a second spacer formed adjacent the second side surface, the second spacer acting as a second floating gate for the memory device;

a gate dielectric layer formed on the first and second spacers and over the dielectric cap, the gate dielectric layer contacting the insulating layer and acting as an inter-gate dielectric for the memory device;

a first gate contacting the insulating layer and disposed on a first side of the fin; and a second gate contacting the insulating layer and disposed on a second side of the fin opposite the first side, wherein the first and second gates are electrically isolated from each other.

2. The memory device of claim 1, further comprising:

a source region and a drain region formed on the insulating layer and disposed adjacent a respective first and second end of the fin structure.

3. The memory device of claim 2, further comprising:

an oxide layer formed on the first and second side surfaces of the fin, the oxide layer acting as a tunnel oxide layer for the memory device.

4. The memory device of claim 3, wherein the oxide layer has a width ranging from about 10 Å to about 100 Å.

5. The memory device of claim 1, wherein the first and second gates are associated with corresponding memory cells that are programmed independently of each other.

6. The memory device of claim 1, wherein each of the first and second spacers comprise polysilicon and have a width ranging from about 100 Å to about 500 Å.

7. The memory device of claim 1, wherein the dielectric cap comprises at least one of a nitride and an oxide.

8. The memory device of claim 1, wherein the insulating layer comprises a buried oxide layer and the fin structure comprises at least one of silicon and germanium.

9. The memory device of claim 8, wherein the fin structure has a width ranging from about 100 Å to about 1000 Å.

10. A non-volatile memory device, comprising:

a substrate;

an insulating layer formed on the substrate;

a conductive fin formed on the insulating layer, the conductive fin having first and second side surfaces and a top surface;

an oxide layer formed on the first and second side surfaces of the conductive fin;

a dielectric cap formed on the top surface of the conductive fin;

a first spacer formed adjacent the first side surface of the fin, the first spacer acting as a first floating gate electrode;

a first gate formed on the insulating layer, the first gate acting as a first control gate for the non-volatile memory device;

a second spacer formed adjacent the second side surface of the fin, the second spacer acting as a second floating gate electrode;

a second gate formed on the insulating layer, the second gate acting as a second control gate for the non-volatile memory device, wherein the first and second gates are formed on opposite sides of the conductive fin and are electrically isolated from each other; and an inter-gate dielectric formed between the first spacer and the first gate, between the second spacer and the second gate and over the dielectric cap, wherein the inter-gate dielectric contacts the insulating layer.

11. The non-volatile memory device of claim 10, wherein the first and second spacers each comprise polysilicon and have a width ranging from about 100 Å to about 500 Å.

12. The non-volatile memory device of claim 10, wherein the dielectric cap comprises a nitride.

13. The non-volatile memory device of claim 10, wherein the oxide layer acts as a tunnel oxide for the memory device and the width of the oxide layer ranges from about 10 Å to about 100 Å.

14. The non-volatile memory device of claim 10, wherein the insulating layer comprises a buried oxide layer and the conductive fin comprises at least one of silicon and germanium.

15. A memory device, comprising:

a substrate;

an insulating layer formed on the substrate;

a fin structure formed on the insulating layer, the fin structure having a first and second side surface and a top surface;

an oxide layer having a width ranging from about 10 Å to about 100 Å formed on the first and second side surfaces of the fin structure, the oxide layer acting as a tunnel oxide layer for the memory device;

a first spacer having a width ranging from about 100 Å to about 500 Å formed adjacent the first side surface of the fin structure, the first spacer acting as a first floating gate for the memory device;

a second spacer having a width ranging from about 100 Å to about 500 Å formed adjacent the second side surface of the fin structure, the second spacer acting as a second floating gate for the memory device;

a gate dielectric layer formed on the first and second spacers and over the top surface of the fin structure;

a first gate contacting the insulating layer and disposed on a first side of the fin structure;

a second gate contacting the insulating layer and disposed on a second side of the fin structure opposite the first side, wherein the first and second gates are electrically isolated from each other;

a source region formed on the insulating layer adjacent a first end of the fin structure; and a drain region formed on the insulating layer adjacent a second end of the fin structure opposite the first end.

16. The memory device of claim 15, wherein the gate dielectric comprises an oxide having a thickness ranging from about 50 Å to about 200 Å.

* * * * *